United States Patent [19]

Lampe

[11] Patent Number: 5,313,173
[45] Date of Patent: May 17, 1994

[54] QUADRATURE MODULATED PHASE-LOCKED LOOP

[75] Inventor: Ross W. Lampe, Raleigh, N.C.

[73] Assignee: Ericsson GE Mobile Communications Inc., Lynchburg, Va.

[21] Appl. No.: 51,875

[22] Filed: Apr. 26, 1993

[51] Int. Cl.$^5$ .................... H03C 3/00; H03L 7/081
[52] U.S. Cl. ............................ 332/103; 331/12;
  331/23; 375/67; 375/60; 375/120
[58] Field of Search .............. 332/103, 104, 105;
  331/16, 23, 12; 375/52, 60, 67, 120

[56] References Cited

U.S. PATENT DOCUMENTS

| | | | |
|---|---|---|---|
| 4,568,888 | 2/1986 | Kimura et al. | 331/16 X |
| 4,951,004 | 8/1990 | Sheffer et al. | 331/1 A |
| 4,965,533 | 10/1990 | Gilmore | 331/18 |
| 5,079,526 | 1/1992 | Heck | 331/23 X |
| 5,130,671 | 7/1992 | Shahriary et al. | 331/16 |
| 5,146,186 | 9/1992 | Vella | 331/16 |
| 5,220,292 | 6/1993 | Bianchini et al. | 331/16 X |

Primary Examiner—David Mis
Attorney, Agent, or Firm—Nixon & Vanderhye

[57] ABSTRACT

A phase-locked loop incorporates a quadrature modulator for generating constant envelope phase or frequency modulation. Locating the quadrature modulator within the feedback loop or feeding the output signal of the quadrature modulator into the feedback loop permits accurate constant envelope phase modulation of the loop reference oscillator and completely suppresses undesired AM and PM components of the modulated signal.

35 Claims, 3 Drawing Sheets

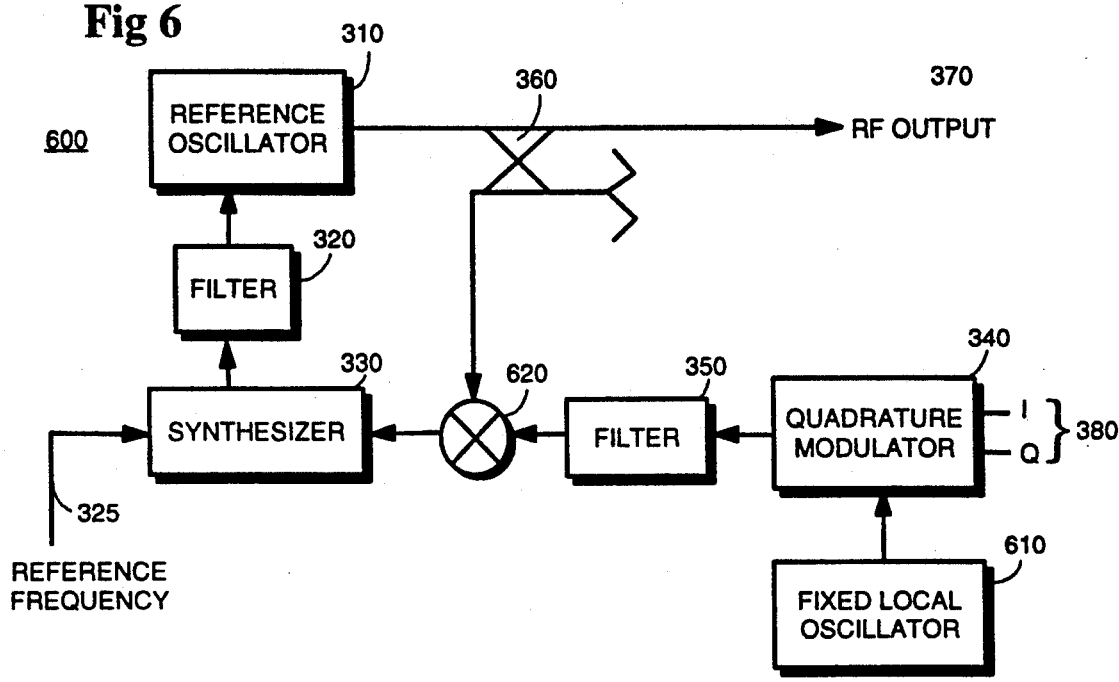
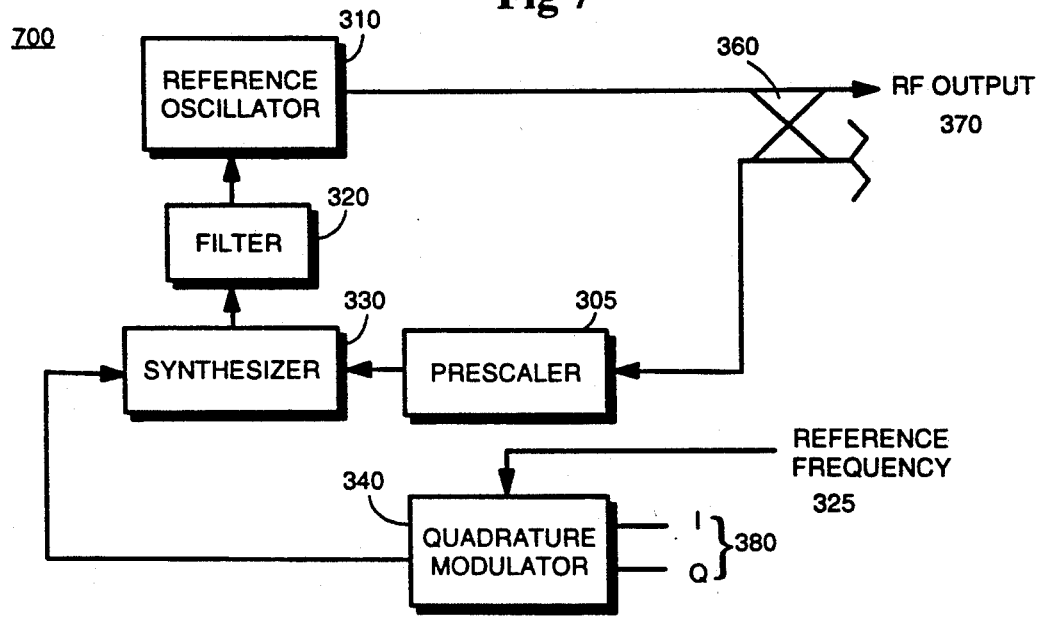

QUADRATURE MODULATED PHASE-LOCKED LOOP

FIELD OF THE INVENTION

The present invention relates to phase locked loops in communications systems, and more particularly, to a phase locked loop that incorporates a quadrature modulator to provide both accurate and constant envelope phase modulation.

BACKGROUND AND SUMMARY OF THE INVENTION

Phase modulation in communications systems may generally be accomplished in one of three ways. The first technique is direct modulation of the transmitter oscillator, typically using a voltage-controlled oscillator (VCO) in a phase-locked loop (PLL) as illustrated in FIG. 1. The desired baseband signal 150 containing signalling information is summed in a summer 130 with an error voltage 180 from a phase detector/comparator 120. This composite signal is then conditioned by low pass filter 140 before being applied to VCO 160. In theory, phase changes in the baseband signal can be preserved through summation and filtering to generate a voltage that regulates the VCO 160 to phase modulate as well as phase lock the RF output signal to the reference oscillator frequency.

In practice, however, this PLL circuit 100 exhibits poor accuracy since it is difficult to determine and generate the specific voltage required to regulate the VCO 160 to obtain the desired phase modulation. Errors introduced by both the summer 130 and the VCO 160 make it very difficult to achieve accurate phase modulation. This accuracy problem is exacerbated by component tolerances, aging, temperature, DC offset in driver amplitudes, and the frequency response of each of the component devices. Thus, the circuit of FIG. 1 fails to provide accurate phase modulation.

Accurate phase modulation can be achieved using a quadrature modulator as illustrated in FIG. 2. Quadrature modulator 200 accepts two modulating inputs: the I, or in-phase component 210, and the Q, or quadrature component 230. The quadrature relationship between these components is achieved by splitting a common reference signal generated by local oscillator 220 with a quadrature hybrid 280 and feeding the resulting orthogonal signals 240, 250 as respective local oscillation signals into in-phase 260 and quadrature 270 mixers. The outputs of the mixers 260, 270 are then summed at summer 290 to form the phase modulated output signal 295.

A major drawback of the quadrature modulator 200 is the generation of phase and amplitude imbalances between the two paths. These imbalances result in leakage of the local oscillator 220 to the modulated output 295 which generates intermodulation products. The imbalances and intermodulation responses manifest themselves as undesired amplitude (AM) and phase modulations (PM) in the phase modulated signal output 295.

Another approach to the accuracy problem is direct digital synthesis (DDS). However, practical direct digital synthesizers generate relatively high levels of spurious outputs, consume more power relative to other approaches, and are generally unsuitable for many narrowband applications.

The phase modulation problems described above are particularly troublesome in narrowband digital communication systems that seek to minimize the bandwidth occupied by transmitted signals. For example, narrowband communication systems often employ saturated (or non-linear) RF power amplifiers because of their relatively high efficiency. Unfortunately, non-linear amplification of amplitude varying signals generates spectral components outside the carrier fundamental frequency. This spectral spreading is particularly undesirable in narrowband communications.

To maintain high efficiency transmission in narrowband communications environments, it is important therefore to avoid amplitude modulation of the carrier signal. Consequently, the carrier is usually modulated with the input information signal using phase or frequency modulation techniques to preserve the constant amplitude envelope of the carrier. While in theory, phase modulation does not affect the amplitude of the input signal, practical phase modulation techniques, e.g. quadrature modulation, suffer residual phase and amplitude modulation imbalances between their in-phase and quadrature paths that lead to the above-described generation of undesired spurious AM and PM components in the output of the modulated signal as described above.

Therefore, when quadrature modulators are used with high efficiency nonlinear amplifiers, it is likely that some amplitude component will be added to the carrier. As a result, undesirable spreading of the transmission spectrum occurs defeating the intent of narrowband signaling. Although the PLL modulator of FIG. 1 provides constant envelope modulation, its poor accuracy as a phase modulator makes it an undesirable alternative.

The present invention accomplishes both of these seemingly incompatible goals of efficiency and narrowband transmission. The present invention provides a quadrature modulated, phase-locked loop for use in a narrowband communication system that does not generate AM or undesirable PM components. A quadrature modulator is either placed within (or fed into) the feedback path of a phase locked loop. The phase modulated feedback signal is compared to a reference frequency signal in a phase comparator such as a digital synthesizer. Since the synthesizer only compares the relative phases of-the input signals, the spurious AM components of the quadrature modulator output are effectively removed. Thus, accurate phase modulation is achieved while still maintaining a constant envelope carrier signal and a subsequent amplification of the modulated carrier by a nonlinear power amplifier does not result in transmission of signals outside the desired bandwidth. The present invention therefore is particularly advantageous for narrowband communications.

A primary phase-locked loop includes an oscillator for generating an output signal in response to a regulating signal. A modulator combines a feedback signal from the output signal with an information signal to produce a modulated signal. A phase comparator compares the phase of the modulated signal with the phase of a reference frequency signal to produce the regulating signal. A first filter is connected between the modulator and the phase comparator for conditioning the modulated signal. A second filter is connected between the phase comparator and the oscillator for conditioning the regulating signal. A sampling means samples the output signal to generate the feedback signal. The modulator may be a quadrature modulator, the sampling means a coupler, the oscillator a voltage or current controlled oscillator, and the phase comparator a digital synthesizer.

A frequency scaler for prescaling the frequency of the feedback signal may be connected in the feedback loop before or after modulation of the feedback signal. The frequency scaler includes a variable local oscillator and a mixer for mixing the local oscillator output signal and the feedback (or modulated) signal. The variable local oscillator may employ a secondary phase-locked loop and includes means for changing the frequency of the variable local oscillator which then tunes the primary phase-lock loop to different frequencies. A low pass filter is provided to minimize phase noise in the primary phase locked loop caused by changes in the local oscillator frequency.

In other embodiments of the present invention, the phase-locked loop includes a reference oscillator for generating an oscillator output signal in response to a regulated signal. A modulator combines the first reference signal and an information signal to produce a modulated signal. A mixer mixes the feedback signal and the modulated signal, and a phase comparator compares the phase of an output signal of the mixer with the phase of a second reference signal to produce the regulated signal. In yet another embodiment, the modulator combines a referenced signal and an information signal to produce a modulated signal, and the phase comparator compares the phase of a feedback signal with the phase of the modulated signal to produce the regulated signal.

The present invention also includes a phase modulation method for maintaining a constant envelope oscillator output signal generated by an oscillator in a phase-locked loop (PLL). The oscillator output signal is sampled to generate a PLL feedback signal which is then modulated with an information signal. The phase of the modulated signal is compared with the phase of a reference signal to determine the difference, and the difference is used to regulate the oscillator. The result of the method of the present invention is that the oscillator output signal is substantially free of spurious amplitude modulation.

In another embodiment, a constant envelope reference oscillation signal is phase modulated with an information signal. Any spurious amplitude modulations generated in the phase modulation are translated into spurious phase modulation components. Thereafter, the phase of the phase modulated signal is compared with the phase of a reference signal to generate a control signal for controlling the phase locked loop, wherein the spurious phase modulation components are removed in the comparing step.

BRIEF DESCRIPTION OF THE DRAWINGS

These and other objects and advantages of the present invention will be made readily apparent to one of ordinary skill in the art from the following written description, read in conjunction with the drawings, in which:

FIG. 6 is an illustration of yet another embodiment of the present invention; and FIG. 7 is an illustration of still another embodiment of the present invention.

DETAILED DESCRIPTION OF THE INVENTION

In the following description, for purposes of explanation and not limitation, specific details are set forth, such as particular circuits, components, techniques, etc. in order to provide a thorough understanding of the present invention. However, it will be apparent to one skilled in the art that the present invention may be practiced in other embodiments that depart from these specific details. In other instances, detailed descriptions of well known methods, devices, and circuits are omitted so as to not obscure the description of the present invention with unnecessary detail.

Figure 1:
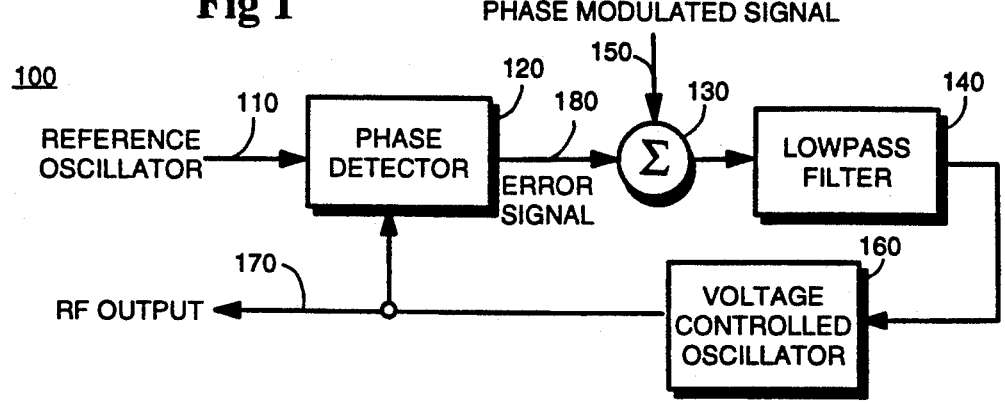
FIG. 1 is a block diagram of a modulated phase-locked loop.
Figure 2:
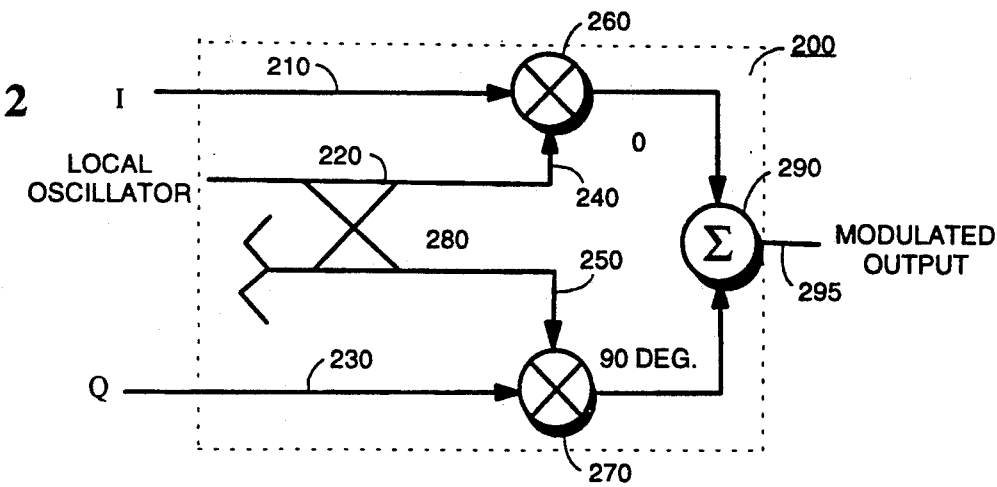
FIG. 2 illustrates a quadrature modulator that may be used in one embodiment of the present invention.
Figure 3:
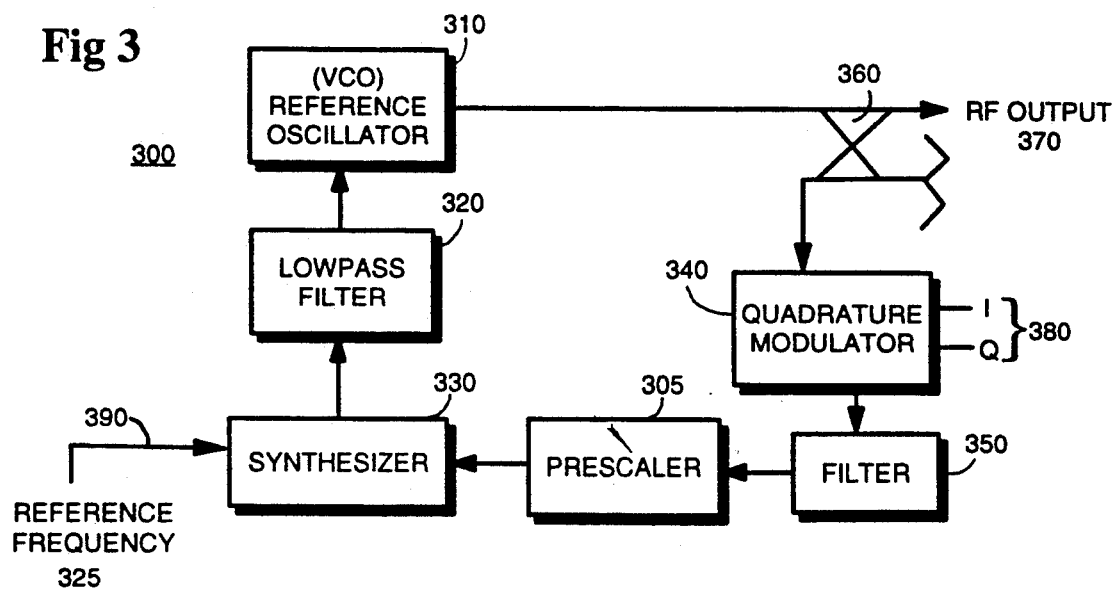
FIG. 3 is a function block diagram of one embodiment of the present invention.

FIG. 3 illustrates one embodiment of the present invention in the form of a quadrature modulated phase-locked loop (PLL) 300. A portion of the RF output signal 370 is sampled by directional coupler 360 and used as the local oscillator input for a quadrature modulator 340 such as the quadrature modulator 200 shown in FIG. 2. The I and Q component modulating inputs 380, corresponding to signalling information to be transmitted, phase modulate the local oscillator signal, i.e., the feedback signal from the directional coupler 360, to generate a modulated output signal as described above in conjunction with FIG. 2.

The phase modulated output is filtered in filter 350 to remove harmonics and spurious signals caused by mixing in the quadrature modulator 340. The conditioned signal is then optionally input into a frequency prescaler 305 for down converting the frequency of the output from quadrature modulator 340 and providing an output to synthesizer/phase comparator 330. Those skilled in the art will recognize that while this frequency scaling may be desirable for reasons set forth below, it is optional and therefore not required to perform or implement the present invention. The synthesizer/phase comparator 330 produces an error voltage proportional in magnitude to the difference in phase between the phase modulated RF output signal and a reference frequency signal 325. This error voltage is filtered in low pass filter 320 before- being applied to tune and lock the VCO 310.

The synthesizer 330 may be for example a digital phase comparator that employs two digital counters, one to count zero voltage crossings of the reference frequency 325 and one to count for example the zero crossings of the quadrature modulator 340 feedback signal over a predetermined time period. The amplitude of the detected signals is irrelevant to the counting process because the counter counts only zero crossings or changes of the signal from one logic state to another logic state. These two count values are compared to determine the phase difference if any between the two signals. If the difference is zero, then the voltage to the VCO 310 is zero and no oscillator adjustment is needed. Otherwise, the difference is converted into an error voltage that regulates the VCO 310 to adjust the phase of the RF output signal to reduce that error.

Although a synthesizer 330 using digital components is described, those skilled in the art will appreciate that the functions of the synthesizer 330 could readily be implemented using analog components. For example, a mixer could be used to mix the reference frequency signal 325 with the feedback signal from the quadrature modulator 340, and the mixer output could be used to regulate the VCO 310 via low pass filter 320.

Phase modulation in the present invention occurs in the feedback signal loop of the PLL, i.e. after—rather than before—the RF output signal is generated by the VCO 310. The phase changes introduced by the quadrature modulator 340 to the sampled RF output signal 370 ultimately generate an error signal generated by the synthesizer 330 which then regulates the VCO 310 to accurately phase modulate the RF output signal 370. Any amplitude modulation components generated by the quadrature modulator 340 are ignored by the synthesizer 330 because it detects only changes in phase. The undesirable phase modulation AM components are effectively filtered out by the synthesizer 330 and have no affect on the amplitude of the RF output signal 370. Thus, the RF output maintains a constant amplitude or envelope, and subsequent nonlinear amplification does not generate spectral components outside the desired transmission bandwidth. In this way, the present invention permits the use of efficient nonlinear power amplifiers in narrowband communication applications.

One constraint of a digital type synthesizer is that its upper end speed is usually limited to operation at frequencies of 30 MHz or lower. The feedback signal from the quadrature modulator 340 may nonetheless be at frequencies of 800 or 900 MHz. Accordingly, the optional prescaler 305 downconverts (using an appropriate division ratio factor) the frequency of the feedback signal from the quadrature modulator 340 to a frequency that the digital circuitry in the synthesizer 330 can more easily handle.

Figure 4:
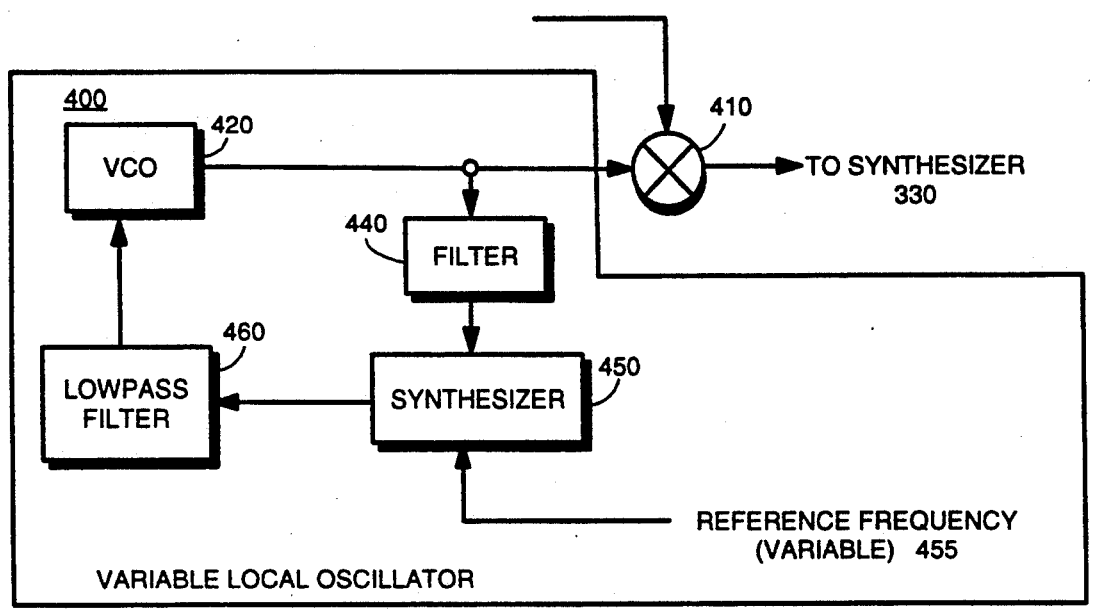
FIG. 4 is a function block diagram of a variable local oscillator that may be used in conjunction with the present invention.

As described now in conjunction with FIG. 4, a variable local oscillator (in the form of a second PLL) 400 and a mixer 410 can be substituted for the optional prescaler 305. This second PLL is sometimes referred to as an offset loop design. The second PLL 400 includes VCO 420 which generates the frequency scaling signal sent to the mixer 410, a filter 440 for conditioning a feedback sample of the scaling signal, and a synthesizer/phase comparator 450 for comparing the frequency of the feedback sample to a reference frequency 455. The output of the synthesizer/phase comparator 450 is conditioned in low pass filter 460 to control VCO 420.

The offset loop design shown in FIG. 4 is advantageous in that the quadrature modulated "main" PLL 300 of FIG. 3 can be designed as a fixed frequency PLL and the VCO 420 of variable "secondary" PLL 400 may be stepped (changed) in frequency to ultimately change the tuning frequency of the main PLL 300, e.g. to provide a radio operator with the capability to transmit on plural frequencies or channels.

One particularly advantageous feature of this offset loop arrangement relates to reduction of spurious noise generated by frequency stepping. If the main quadrature modulated PLL 300 is a variable rather than a fixed PLL, spurious noise signals will be generated at every frequency step. For example, if frequency can be incremented in 6.25 kHz steps, then a spurious noise response will likely occur at 6.25 kHz. In addition, if the bandwidth of the phase modulated feedback signal is 5 kHz, the passband of low pass filter 320 of the main PLL 300 must be at least that wide to pass the phase modulated signal. Unfortunately, the spurious signal response caused at the 6.25 kHz step is not adequately filtered by filter 320 and distorts the information signal. However, if secondary PLL 400 is used to step frequency every 6.25 kHz, the low pass filter 460 can be set to a significantly lower passband such as 200 Hz. In this way, the frequency can be stepped in secondary PLL 400 while still eliminating spurious noise in the main PLL 300 response at stepped frequencies.

Another advantage of the offset loop design shown in FIG. 4 relates to the reduction of phase noise of the reference oscillator 310. A very high stability crystal oscillator may be used to generate reference frequency 325. However, these types of high stability oscillators do not oscillate at higher rf frequencies especially in the range of hundreds of MHz. As a result, the feedback signal frequency must be divided one or more times so that phase comparison can take place with the lower but very stable reference frequency 325 in synthesizer 330. However, every time the reference oscillator 310 frequency is divided down (e.g. by two), the phase noise of reference oscillator 310 increases substantially. Even though some frequency division is necessary because of the practical limitations of crystal oscillators, it is best to minimize the extent of such division to keep phase noise to a minimum.

The offset loop design illustrated in FIG. 4 permits use of a higher comparison frequency in synthesizer 330 resulting ultimately in a lower phase noise characteristic for reference oscillator 310. If synthesizer 330 is stepped instead of the prescaler 305 accomplishing this frequency stepping function, then the comparison reference frequency would need to be divided down to the step size (a relatively low reference frequency). However, if the frequency stepping takes place in the secondary PLL 400, the comparison frequency in the primary PLL may be substantially raised.

Figure 5:
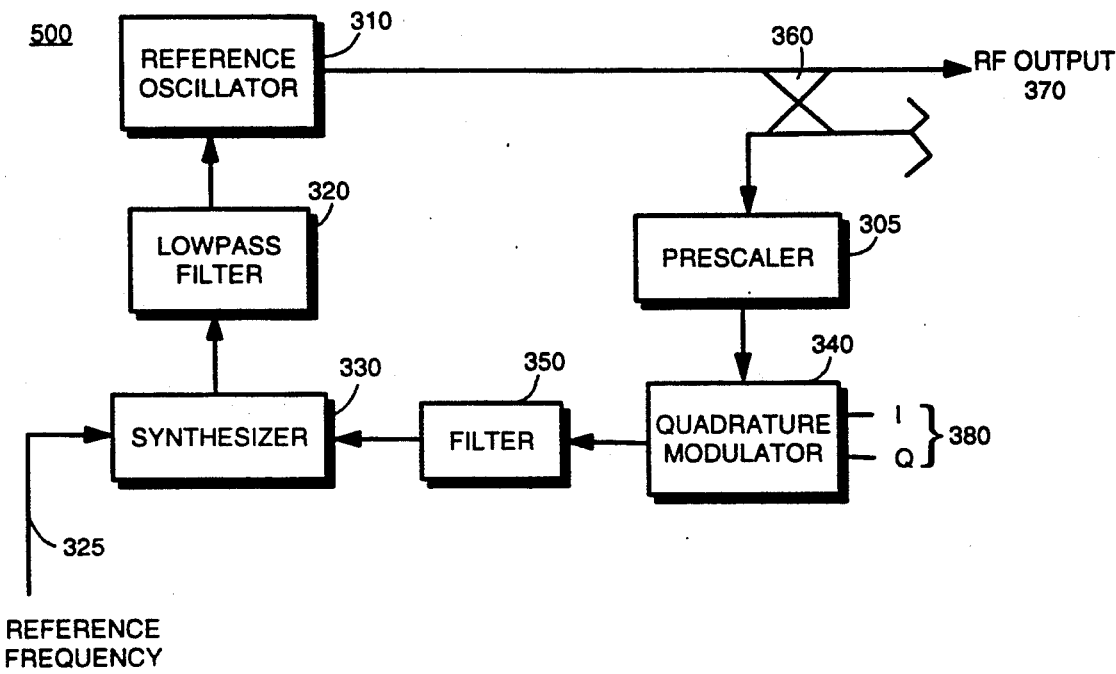
FIG. 5 is an illustration of another embodiment of the present invention.

Another embodiment of the present invention is illustrated in FIG. 5. The arrangement 500 is similar to that shown in FIG. 3 with like reference numerals referring to like elements and where prescaler 305 may also be used. However, the sampled RF output is down converted (and possibly stepped) in frequency by the prescaler 305 located between the coupler 360 and the quadrature modulator 340 based on a low frequency signal generated by VCO 420. An advantage of arrangement 500 is that the prescaler output can be at a lower frequency permitting a narrowband quadrature modulator 340 to be operated at a lower frequency resulting in lower levels of spurious AM and PM signals. The advantage of this embodiment is that quadrature modulation can be implemented with tighter tolerances for better performances at lower (video)frequencies rather than higher RF frequencies.

Yet another embodiment of the present invention is shown in FIG. 6 again with like reference numerals referring to like elements. In arrangement 600, the quadrature modulator 340 is not directly in the feedback path of the quadrature modulator PLL 300 as shown in FIG. 3. Instead, it is in the reference frequency signal path and is injected into the feedback path at mixer 620. A fixed frequency local oscillator 610 such as the PLL 400 shown in FIG. 400 generates the local oscillator signal to the quadrature modulator 340 rather than the RF feedback sample as in the arrangement in FIG. 3. The phase modulated reference signal is then conditioned in filter 350 and mixed with the RF feedback sample in mixer 620. An advantage of arrangement 600 is that both the quadrature modulator 340 and the fixed local oscillator 610 operate at fixed frequencies. At fixed frequencies, lower level spurious AM and PM signals are generated by the quadrature modulator 340, and the PLL 300 could be designed to provide for operation at multiple frequencies.

A variation of arrangement 600 is illustrated as arrangement 700 in FIG. 7 again with like reference numerals referring to like elements. As with the arrangement 600 of FIG. 6, the quadrature modulator 340 is in the path of the reference signal rather than in the feedback signal path. However, the quadrature modulator 340 receives as its local oscillator input the reference frequency signal 325. The phase modulated reference signal is then compared in synthesizer 330 to the RF output sample via prescaler 305.

Arrangement 700 achieves similar beneficial results as in the arrangements described above. In addition, placing the quadrature modulator 340 outside the feedback path provides other advantages in addition to phase modulating the feedback signal. Normally, the operation of a phase-locked loop is restricted to locking the reference oscillator 310 to certain specific frequencies as determined by the integer division of the frequency of the reference oscillator 310 output signal and the reference frequency 325 within the prescaler 305 and synthesizer 330. In arrangement 700 (and the other disclosed embodiments), a frequency offset can be added through the I-Q inputs 380 (210 and 220 in FIG. 2) of the quadrature modulator 340 thereby providing a wider range of frequencies generated by the PLL.

Arrangement 700 also permits modification of the modulated waveform to correct for phase or frequency distortion caused by the impulse response of the phase locked loop transfer function $H(\omega)$ corresponding to filter 320. In other words, filtering the quadrature modulator 340 output distorts the modulated waveform. However, if the I and Q signals are processed before input to quadrature modulator 340 in filter 320 using the inverse transfer function $H^{-1}(\omega)$ of filter 320 (e.g. in a signal processor not shown), then the modulated signal output from filter 320 is free of the distortion normally caused by that filter.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A phase-locked loop (PLL) phase modulator comprising:
    an oscillator for generating a phase modulated carrier signal in response to a regulating signal;
    a quadrature modulator for combining the phase modulated carrier signal and information signals to produce a quadrature modulated signal; and
    a phase comparator for comparing the phase of the quadrature modulated signal with the phase of a reference frequency signal to produce the regulating signal.

2. The phase-locked loop phase modulator according to claim 1, further comprising:
    a first filter, connected between the modulator and the phase comparator, for conditioning the modulated signal;
    a second filter, connected between the phase comparator and the oscillator, for conditioning the regulating signal; and
    sampling means for sampling the output signal and generating the feedback signal.

3. The phase-locked loop phase modulator according to claim 2 wherein the sampling means is a coupler.

4. The phase-locked loop phase modulator according to claim 1 wherein the oscillator is a voltage or current controlled oscillator.

5. The phase-locked loop phase modulator according to claim 1 wherein the phase comparator is a digital synthesizer.

6. The phase-locked loop phase modulator according to claim 5 wherein the information signals include in-phase and quadrature information signals for phase or frequency modulating a reference signal and the quadrature modulator includes:
    first and second local reference signals which are 90 degrees out of phase;
    a first mixer for mixing the in-phase information signal and the first local reference signal;
    a second mixer for mixing the quadrature information signal and the second local reference signal; and
    a summer for summing outputs from the first and second mixers to generate the quadrature modulated signal.

7. The phase-locked loop phase modulator according to claim 6 wherein the first and second local reference signals are generated from the phase modulated carrier signal.

8. The phase-locked loop phase modulator according to claim 6 wherein the first and second local reference signals are generated from another oscillator.

9. The phase-locked loop phase modulator according to claim 6 wherein the first and second local reference signals are generated from the reference signal.

10. The phase-locked loop phase modulator according to claim 1 further comprising:
    a frequency scaler for scaling the frequency of the phase modulated carrier signal.

11. The phase-locked loop phase modulator according to claim 10 wherein the frequency scaler is connected between the quadrature modulator and the phase comparator.

12. The phase-locked loop phase modulator according to claim 10 wherein the frequency scaler scales the frequency of the phase modulated carrier signal before being combined in the quadrature modulator with the information signal.

13. The phase-locked loop phase modulator according to claim 10 wherein the frequency scaler includes:
    a variable local oscillator,
    a mixer for mixing a local oscillator output signal generated by the variable local oscillator and the phase modulated carrier signal.

14. The phase-locked loop phase modulator according to claim 10 wherein the frequency scaler includes:
    a variable local oscillator,
    a mixer for mixing a local oscillator output signal generated by the variable local oscillator and the quadrature modulated signal.

15. The phase-locked loop phase modulator according to claim 14 wherein the variable local oscillator includes:
    means for changing the frequency of the variable local oscillator to permit the PLL phase modulator to tune to different frequencies, and a low pass filter for minimizing phase noise in the PLL phase modulator caused by changes in the local oscillator frequency.

16. A phase-locked loop phase modulator comprising:
a reference oscillator for generating a phase modulated carrier signal in response to a regulating signal;
a quadrature modulator for combining a first reference signal and information signals to produce a quadrature modulated signal;
a mixer for mixing the phase modulated carrier signal and the quadrature modulated signal; and
a phase comparator for comparing the phase of an output signal of the mixer with the phase of a second reference signal to produce the regulating signal.

17. The phase-locked loop phase modulator according to claim 16, further comprising:
a filter, connected between the phase comparator and the oscillator, for conditioning the regulating signal, and
sampling means for sampling the oscillator output signal and generating the phase modulated carrier signal.

18. The phase-locked loop phase modulator according to claim 17 wherein the sampling means is a coupler.

19. The phase-locked loop phase modulator according to claim 16 wherein the oscillator is a voltage or current controlled oscillator.

20. The phase-locked loop phase modulator according to claim 16 wherein the phase comparator is a digital synthesizer.

21. A phase-locked loop phase modulator comprising:
an oscillator for generating a phase modulated carrier signal in response to a regulating signal;
a quadrature modulator for combining a reference signal and information signals to produce a quadrature modulated signal; and
a phase comparator for comparing the phase of the phase modulated carrier signal with the phase of the quadrature modulated signal to produce the regulating signal.

22. The phase-locked loop phase modulator according to claim 21, further comprising:
a filter, connected between the phase comparator and the oscillator, for conditioning the regulating signal, and
sampling means for sampling the phase modulated carrier signal.

23. The phase-locked loop phase modulator according to claim 22 wherein the sampling means is a coupler.

24. The phase-locked loop phase modulator according to claim 21 wherein the oscillator is a voltage or current controlled oscillator.

25. The phase-locked loop phase modulator according to claim 21 wherein the phase comparator is a digital synthesizer.

26. The phase-locked loop phase modulator according to claim 21 further comprising:
a frequency scaler for scaling the frequency of the feedback signal.

27. A phase modulation method for maintaining a constant envelope oscillator output signal generated by an oscillator in a phase-locked loop (PLL) comprising:
sampling the oscillator output signal to generate a PLL feedback signal;
quadrature modulating the PLL feedback signal with in-phase and quadrature information signals,
comparing the phase of the quadrature modulated signal with the phase of a reference signal to determine a difference signal; and
regulating the oscillator using the difference signal, wherein the oscillator output signal is substantially free of spurious amplitude modulation.

28. A method according to 27, wherein the modulating step includes quadrature modulating the feedback signal with in-phase and quadrature information signals.

29. A method according to claim 27, further comprising:
scaling the frequency of the quadrature modulated signal before the comparing step.

30. A method according to claim 27, further comprising:
scaling the frequency of the PLL feedback signal before the modulating step.

31. A phase modulation method for maintaining a constant envelope oscillator output signal generated by an oscillator in a phase-locked loop (PLL) comprising:
sampling the oscillator output signal to generate a PLL feedback signal;
quadrature modulating a first reference signal based on in-phase and quadrature information signals to generate a quadrature modulated signal;
combining the quadrature modulated signal with the PLL feedback signal;
comparing the phase of the combined signal with the phase of a second reference signal to determine a difference signal; and
regulating the oscillator using the difference signal, wherein the oscillator output signal is substantially free of spurious amplitude modulation.

32. A method according to claim 31, further comprising:
scaling the frequency of the quadrature modulated signal before the comparing step.

33. A method according to claim 31, further comprising:
scaling the frequency of the feedback signal before the quadrature modulating step.

34. A phase modulation method for use in a phase locked loop comprising:
generating a constant envelope reference oscillation signal;
phase modulating the reference oscillation signal with an information signal;
translating any spurious amplitude modulation generated in the phase modulating step into spurious phase modulation components; and
comparing the phase of the phase modulated signal with the phase of a reference signal to generate a control signal for controlling the PLL, wherein the spurious phase modulation components are removed in the comparing step.

35. A phase-locked loop (PLL) phase modulator, comprising:
an oscillator for generating a phase modulated output signal in response to a regulating signal;
a quadrature modulator for combining in-phase and quadrature information signals with the phase modulated output signal to generate a phase modulated input signal; and
a phase comparator for comparing the phase of the phase modulated input signal with the phase of a reference frequency to produce the regulating signal,
wherein a transfer function defined as the phase modulated output signal divided by the phase modulated input signal compensates for undesired amplitude or phase modulations generated by the quadrature modulator.

* * * * *